US012772427B2

(12) United States Patent
Kim et al.

(10) Patent No.: US 12,772,427 B2
(45) Date of Patent: Oct. 20, 2026

(54) COMMUNICATION LINE

(71) Applicant: UNIQCONN INC., Seongnam-si (KR)

(72) Inventors: Young Dong Kim, Hwaseong-si (KR); Yong Hun Oh, Pyeongtaek-si (KR); Joung Min Park, Osan-si (KR); Gi Yun Um, Seongnam-si (KR)

(73) Assignee: UNIQCONN INC., Seongnam-si (KR)

( * ) Notice: Subject to any disclaimer, the term of this patent is extended or adjusted under 35 U.S.C. 154(b) by 85 days.

(21) Appl. No.: 18/888,560

(22) Filed: Sep. 18, 2024

(65) Prior Publication Data

US 2025/0120054 A1 Apr. 10, 2025

(30) Foreign Application Priority Data

Oct. 4, 2023 (KR) ........................ 10-2023-0132033

(51) Int. Cl.
*H05K 9/00* (2006.01)

(52) U.S. Cl.
CPC .................................... *H05K 9/006* (2013.01)

(58) Field of Classification Search
CPC ................................. H01P 3/16; H05K 9/006
See application file for complete search history.

(56) References Cited

U.S. PATENT DOCUMENTS

| | | | | |
|---|---|---|---|---|
| 5,333,229 A * | 7/1994 | Sayegh | G02B 6/105 385/11 |
| 2015/0295300 A1* | 10/2015 | Herbsommer | H01P 11/006 333/81 B |
| 2015/0327357 A1* | 11/2015 | Khan | H01P 3/084 333/243 |
| 2017/0170539 A1* | 6/2017 | Morgan | H01P 3/16 |
| 2018/0198184 A1* | 7/2018 | Onishi | H01P 3/122 |
| 2018/0301782 A1* | 10/2018 | Rusch | H01P 3/16 |

FOREIGN PATENT DOCUMENTS

| | | |
|---|---|---|
| KR | 10-2010-0032769 A | 3/2010 |
| KR | 10-1017951 B1 | 3/2011 |
| KR | 10-2018-0094066 A | 8/2018 |
| KR | 10-2019-0065239 A | 6/2019 |

* cited by examiner

*Primary Examiner* — Hung V Ngo
(74) *Attorney, Agent, or Firm* — Studebaker Brackett PLLC

(57) ABSTRACT

The present invention relates to a communication line. The communication line according to an embodiment of the present invention includes a shielding portion including a shielding having a hollow tubular shape, a core portion including a dielectric core that is located inside the shielding portion and extends in a longitudinal direction, and one rib that is located between the shielding portion and the core portion and connects the shielding portion and the core portion.

12 Claims, 6 Drawing Sheets

COMMUNICATION LINE

CROSS-REFERENCE TO RELATED APPLICATION

This application claims priority to and the benefit of Korean Patent Application No. 10-2023-0132033, filed on Oct. 4, 2023, the disclosure of which is incorporated herein by reference in its entirety.

BACKGROUND

1. Field of the Invention

The present invention relates to a communication line, and more particularly, to a communication line for signal transmission.

2. Discussion of Related Art

Communication lines made of dielectrics have a lower manufacturing cost than conductor-based communication lines and their installation and management are easier than optical-based communication lines, hereby efficiently utilizing the communication lines in chip-to-chip communications.

However, conventional communication lines have a problem in that an amount of the outside leakage of signals propagating in the conventional communication lines is excessive. Accordingly, the signals propagating through the conventional communication lines become incomplete, and as the length of the communication line increases, the attenuation of the signal may increase, cumulative signal loss may increase, and noise may be generated in electronic devices around the communication line.

Further, chip-to-chip communication may be performed in enclosed spaces such as server cases or computer cases, and in this case, excessive force is required to bend conventional communication lines. Accordingly, the conventional communication lines have the problem in that the conventional communication lines are difficult to be used in narrow or complex spaces because their shapes are not easily changed.

Meanwhile, the related art described above is technical information that the inventor possessed for deriving the present invention or acquired during the process of deriving the present invention, and cannot necessarily be considered as publicly known technology disclosed to the general public prior to the application of the present invention.

RELATED ART DOCUMENT

Patent Document (Patent Document 1) Korean Laid-open Patent Publication No. 10-2010-0032769 (Mar. 26, 2010)

SUMMARY OF THE INVENTION

The present invention is directed to providing a communication line that includes one rib so that a magnetic field emitted to the outside can be reduced.

The present invention is also directed to providing a communication line that includes one rib so that bending freedom degree and easiness are increased.

The present invention is also directed to providing a communication line that includes a supporter portion so that a shape of a shielding is not deformed within a certain level when the communication line receives external impact or is bent.

Objects of the present invention are not limited to the above-described object and other objects that are not described may be clearly understood by those skilled in the art from the following descriptions.

According to an aspect of the present invention, there is provided a communication line which includes a shielding portion including a shielding having a hollow tubular shape, a core portion including a dielectric core that is located inside the shielding portion and extends in a longitudinal direction, and one rib that is located between the shielding portion and the core portion and connects the shielding portion and the core portion.

The core portion may further include a first supporter portion formed to extend on an outer surface of the dielectric core, and the shielding portion may further include a second supporter portion formed to extend on an inner circumferential surface of the shielding to correspond to the first supporter portion.

The first supporter portion and the second supporter portion may be formed to be spaced apart from each other.

The second supporter portion may be formed at a location where the second supporter portion comes into contact with the first supporter portion when physically deformed.

A direction in which the first supporter portion is formed on the dielectric core may be opposite to a direction in which the second supporter portion is formed on the inner circumferential surface of the shielding.

The first supporter portion may include a first support member formed to extend on the outer surface of the dielectric core, and a protruding member that is formed to extend on an outer surface of the first support member and comes into contact with the second supporter portion when physically deformed.

The second supporter portion may include a second support member formed to extend on an inner surface of the shielding, and a buffer member that is formed to extend on an outer surface of the second support member and comes into contact with the first supporter portion when physically deformed.

An area of the buffer member may be determined based on the number of first supporter portions.

The first supporter portion may be provided as three first supporter portions, and the three first supporter portions and the one rib may be formed at equal intervals along a circumference of the dielectric core.

The first supporter portion may be provided as two first supporter portions, and the two first supporter portions and the one rib may be formed at equal intervals along a circumference of the dielectric core.

The first supporter portion may be provided as one first supporter portion, and the one first supporter portion and the one rib may be formed on the same straight line in a radial direction of the dielectric core.

The shielding portion, the core portion, and the rib may be made of a dielectric material and formed integrally.

The dielectric core may have a hollow tubular shape, and an electromagnetic wave signal received at one end of the dielectric core may be transmitted to the other end of the dielectric core in the longitudinal direction.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
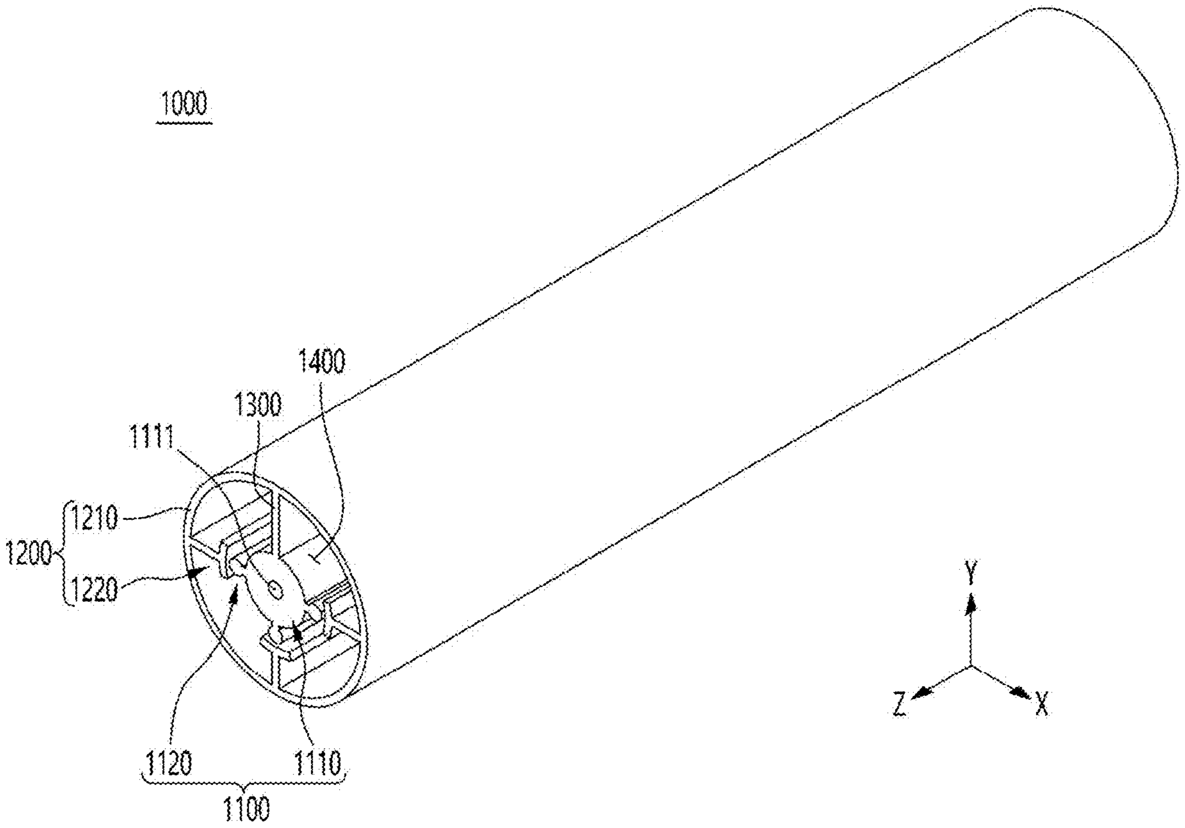
FIG. 1 is a perspective view of a communication line according to an embodiment of the present invention.

Advantages and features of the present invention and methods of achieving the same will be clearly understood with reference to the accompanying drawings and embodiments described in detail below. However, the embodiments are provided in order to fully explain the present invention and fully explain the scope of the present invention for those skilled in the art. The scope of the present invention is only defined by the appended claims. Therefore, the present invention is not limited to the embodiments disclosed below, but may be implemented in various different forms without departing from the technical spirit of the present invention. That is, the scope of the present invention should be interpreted by the claims, and all technical ideas within the scope equivalent thereto should be construed as being included in the scope of the present invention.

The shapes, sizes, ratios, angles, numbers, or locations disclosed in the drawings for describing the embodiments of the present invention are exemplary, and therefore, the present invention is not limited to the matters illustrated. Further, even when only some components described in the claims are illustrated in the drawings, the components are selected as examples to clarify the description of the embodiments. That is, the drawings may be illustrated by selecting some configurations or operations that can most effectively convey the technical features or effects of the present invention.

Further, in description of a plurality of embodiments of the present invention in order, the configurations or operations of the present invention already described in the previously described embodiments are included again in the embodiments being described, and when the respective embodiments have substantially the same configuration or operation when compared organically, the descriptions of the configuration or operations may be omitted for a clear and concise description.

In description of the present invention, when it is determined that detailed descriptions of related well-known functions or configurations may unnecessarily obscure the gist of the present invention, detailed descriptions thereof will be omitted. Further, when the terms “include,” “have,” “consist of,” etc., are used in this specification, another portion may be added unless “only” is used. Further, when a component is expressed in the singular form, it includes a case where it includes a plural form unless the context clearly indicates otherwise. Further, in interpretation of components, it is interpreted as including a range of errors even when there is no separate explicit description.

It should be understood that, although the terms “first,” “second,” etc., may be used herein to describe various components, these components are not limited by these terms. The terms are only used to distinguish one component from another component. Therefore, it should be understood that a first component to be described below may be a second component within the technical scope of the present invention.

The individual features of the various embodiments of the present invention may be partially or wholly combined or combined with each other, and as can be fully understood by those skilled in the art, various technical connections and operations are possible, and each embodiment may be implemented independently of each other or may be implemented together in a related relationship.

In description of various embodiments of the present invention, when some configuration of an embodiment is substantially the same as or corresponding to some configuration of another embodiment described above, the description of that configuration may be omitted for a clear and concise description of the present invention. Further, when some configurations have a structure that is symmetrical with other configurations, for example, a structure with axial symmetry or rotational symmetry, so that both configurations are substantially the same configuration with only a difference in direction or location, the description of the configuration may be omitted for the sake of a clear and concise description of the present invention, unless it is necessary to specify the present invention.

Hereinafter, the present invention will be described in detail with reference to the accompanying drawings.

Figure 2:
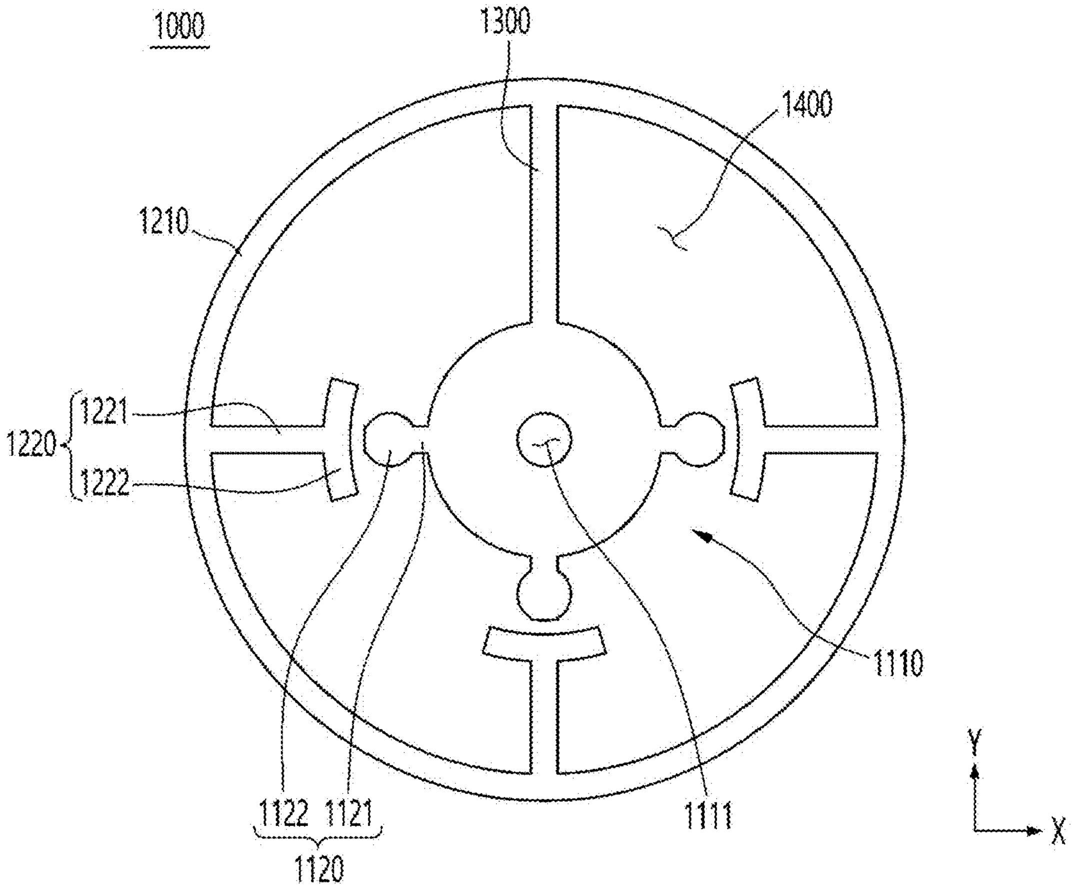
FIG. 2 is a cross-sectional view of the communication line in a direction perpendicular to a longitudinal direction according to an embodiment of the present invention.

FIG. 1 is a perspective view of a communication line according to an embodiment of the present invention. FIG. 2 is a cross-sectional view of the communication line in a direction perpendicular to a longitudinal direction according to an embodiment of the present invention.

First, referring to FIGS. 1 and 2, a communication line 1000 may include a core portion 1100, a shielding portion 1200, and a rib 1300.

The core portion 1100 may include a dielectric core 1110 and a first supporter portion 1120.

The dielectric core 1110 may be formed to be located inside the shielding portion 1200 and extend in the longitudinal direction. The longitudinal direction may be a Z-axis direction illustrated in FIG. 1.

The dielectric core 1110 may have a hollow tubular shape. For example, a central hole 1111 may be formed inside the dielectric core 1110. Further, an outer surface of the dielectric core 1110 and the central hole 1111 may have a circularly extended shape. In this case, as illustrated in FIGS. 1 and 2, the dielectric core 1110 and the central hole 1111 may share a central axis. However, the shapes and locations of the dielectric core 1110 and the central hole 1111 are not limited thereto. For example, a cross-section of the central hole 1111 in a direction perpendicular to the longitudinal direction may have a polygonal shape and the central hole 1111 may be formed outside the central axis of the dielectric core 1110.

Meanwhile, permittivity is a value for the effect of a medium between charges on an electric field when the electric field acts between the charges, and depends on the frequency of an electromagnetic wave signal propagating in a dielectric. Further, when an electromagnetic wave signal propagates toward a boundary between materials having different permittivities, the electromagnetic wave signal may be adjusted to be totally reflected at the boundary between the two materials by adjusting permittivity, a signal incident angle of each of the two materials, or a frequency of the signal. Accordingly, by utilizing the above-described characteristics, the electromagnetic wave signal received at one end of the dielectric core 1110 in the communication line 1000 according to the embodiment of the present invention may be transmitted to the other end of the dielectric core 1110 in the longitudinal direction thereof.

Meanwhile, a material of the dielectric core 1110 may be a material having a higher permittivity than the air has. The electromagnetic wave signal transmitted through the dielectric core 1110 may be totally reflected inside the dielectric core 1110 without externally leaking to an air layer 1400. That is, according to the embodiment of the present invention, the air layer 1400 may prevent the electromagnetic wave signal transmitted through the dielectric core 1110 from leaking out of the dielectric core 1110. The air layer 1400 may be formed inside a shielding 1210 of the shielding portion 1200. The air layer 1400 may include the air or a dielectric different from the dielectric core 1110.

Here, the air layer 1400 may be filled with a dielectric material having a different permittivity from the permittivity of the material of the dielectric core 1110. For example, the air layer 1400 may be filled with a flexible dielectric material.

Meanwhile, in the communication line 1000 according to an embodiment of the present invention, the core portion 1100, the shielding portion 1200, and the rib 1300 may be made of the same dielectric material. In this case, since the permittivity is the same in all portion of the communication line 1000, the frequency of the signal may be easily adjusted so that the signal transmitted through the dielectric core 1110 does not leak to the air layer 1400.

In some cases, in the communication line 1000 according to an embodiment of the present invention, the core portion 1100, the shielding portion 1200, and the rib 1300 may be made of the same flexible dielectric material. In this case, since the force required for bending is the same in all portion of the communication line 1000, the shape of the communication line 1000 may be easily changed. Accordingly, even in a narrow space, the communication line 1000 may be installed in various shapes to connect a chip to a chip. Further, since the central hole 1111 is formed inside the dielectric core 1110, the communication line 1000 may be flexibly bent with a small force.

Meanwhile, the first supporter portion 1120 may be formed to extend on the outer surface of the dielectric core 1110. The first supporter portion 1120 may include a first support member 1121 and a protruding member 1122. In one embodiment, the first supporter portion 1120 may include only the first support member 1121. The number of first supporter portions 1120 may be one or more.

The first support member 1121 may be formed to extend on the outer surface of the dielectric core 1110. The first support member 1121 may be located between the dielectric core 1110 and the protruding member 1122 to fix the protruding member 1122 to the dielectric core 1110.

The protruding member 1122 may be formed to extend on an outer surface of the first support member 1121. For example, the protruding member 1122 may be formed on one surface of the first support member 1121 that is opposite to the other surface of the first support member 1121 in contact with the dielectric core 1110.

The protruding member 1122 may come into contact with a second supporter portion 1220 of the shielding portion 1200 when physically deformed. A detailed description thereof will be described below with reference to FIG. 3. In one embodiment, examples of the physical deformation may include external impact, bending, etc.

The protruding member 1122 may have a shape with a circular cross section. However, the shape of the protruding member 1122 is not limited thereto. For example, the cross section of the protruding member 1122 may be a polygonal shape. For another example, the protruding member 1122 may have the same shape as the rib 1300.

Meanwhile, the shielding portion 1200 may include the shielding 1210 and the second supporter portion 1220.

The shielding 1210 may have a hollow tubular shape. Therefore, the core portion 1100 may be formed inside the shielding portion 1200, that is, inside the shielding 1210.

The second supporter portion 1220 may be formed to extend on an inner circumferential surface of the shielding 1210 to correspond to the first supporter portion 1120. The number of second supporter portions 1220 may correspond to the number of first supporter portions 1120.

The second supporter portion 1220 may be formed at a location where the second supporter portion 1220 comes into contact with the first supporter portion 1120 when physically deformed. That is, the first supporter portion 1120 and the second supporter portion 1220 may be formed to be spaced apart from each other, and may come into contact with each other only when physically deformed. Since the first supporter portion 1120 and the second supporter portion 1220 come into contact with each other when physically deformed, the shape of the shielding 1210 is not deformed within a certain degree, thereby minimizing transmission loss in the communication line 1000.

The second supporter portion 1220 may include a second support member 1221 and a buffer member 1222.

The second support member 1221 may be formed to extend on an inner surface of the shielding 1210. The second support member 1221 may be located between the shielding 1210 and the buffer member 1222 to fix the buffer member 1222 to the shielding 1210.

The buffer member 1222 may be formed to extend on an outer surface of the second support member 1221. For example, the buffer member 1222 may be formed on one surface of the second support member 1221 that is opposite to the other surface of the second support member 1221 in contact with the shielding 1210.

The buffer member 1222 may come into contact with the protruding member 1122 of the first supporter portion 1120 when physically deformed. A detailed description thereof will be described below with reference to FIG. 3.

A shape and area of the buffer member 1222 may be determined based on the number of first supporter portions 1120. When a physical impact is applied to the communication line 1000, the rib 1300 and the dielectric core 1110 are shaken, and the buffer member 1222 may support the first supporter portion 1120 so that the first supporter portion 1120 does not shake excessively. Therefore, the buffer member 1222 may have a shape and an area to prevent the shaking of the first supporter portion 1120.

Further, the shape and the area of the buffer member 1222 for preventing the shaking of the first supporter portion 1120 may be determined based on the number of first supporter portions 1120 provided in the communication line 1000. For example, as illustrated in FIG. 2, when the number of first supporter portions 1120 is four, each buffer member 1222 may prevent only unidirectional movement of the corresponding dielectric core 1110 to prevent the shaking of the first supporter portion 1120. Accordingly, one surface of the buffer member 1222 may have a first shape similar to a surface of the first supporter portion 1120, which faces the one surface. In this case, the buffer member 1222 may have a first area.

Figure 5:
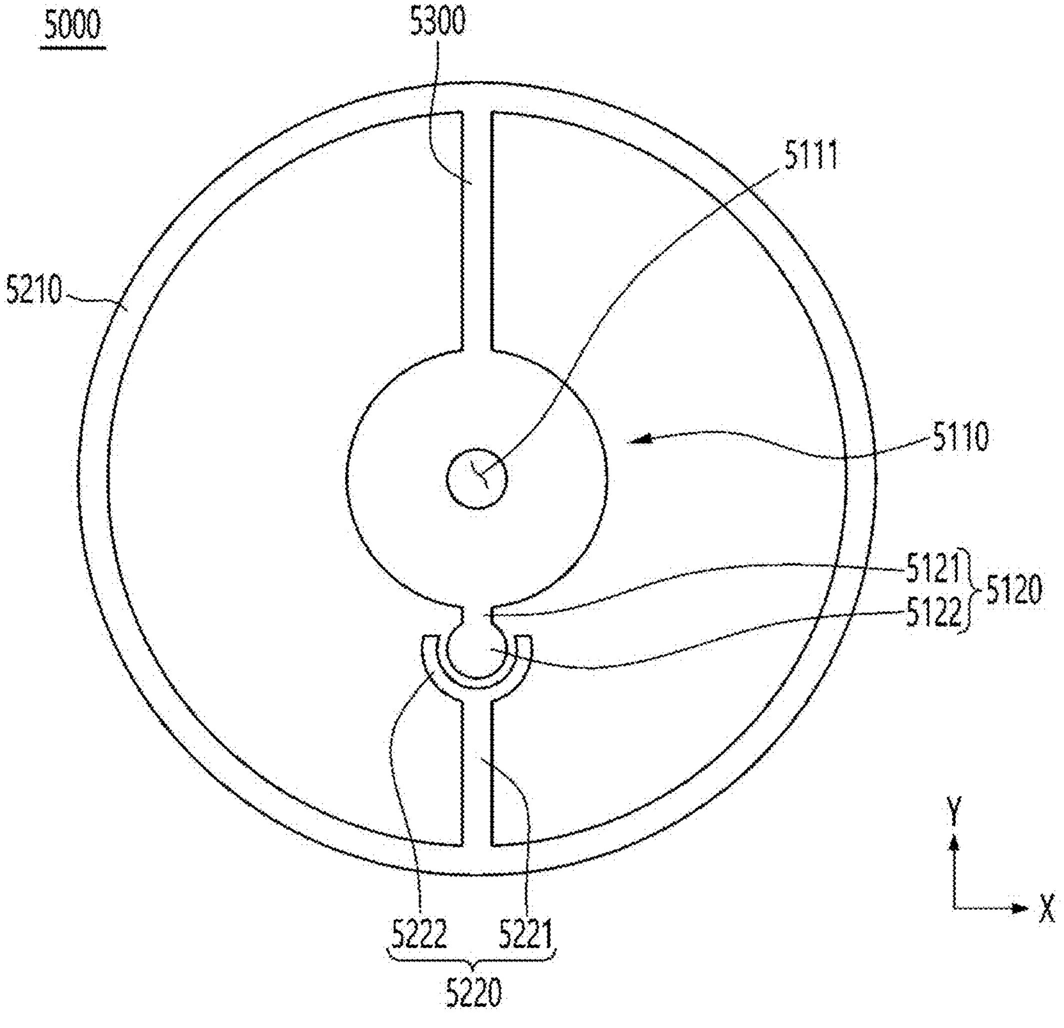
FIG. 5 is a cross-sectional view of a communication line in a direction perpendicular to a longitudinal direction according to still another embodiment of the present invention.

For another example, as illustrated in FIG. 5, when the number of first supporter portions 5120 is one, a buffer member 5222 should prevent both left and right movement of the first supporter portion 5120 to prevent the shaking of a dielectric core 5110. Accordingly, the buffer member 5222 may have a second shape with a greater curvature than that of the first shape so as to surround one end of the first supporter portion 5120. Further, the buffer member 5222 may have a second area that is wider than the first area. A detailed description of FIG. 5 will be described below.

Meanwhile, the buffer member 1222 may have a straight or curved shape so that the buffer member 1222 comes into smooth contact with the protruding member 1122 of the first supporter portion 1120 when physically deformed. For example, the buffer member 1222 may have a U-shaped curved shape that surrounds the protruding member 1122.

Meanwhile, a direction in which the first supporter portion 1120 is formed in the dielectric core 1110 and a direction in which the second supporter portion 1220 is formed on the inner circumferential surface of the shielding 1210 may be opposite to each other. Here, the opposite may mean a view in a 180° direction. That is, the first support member 1121 of the first supporter portion 1120 and the second support member 1221 of the second supporter portion 1220 may be present on the same straight line. Therefore, when physically deformed, the second supporter portion 1220 may more firmly sustain the force received from the first supporter portion 1120 without deformation.

The rib 1300 may be located between the shielding portion 1200 and the core portion 1100 and connect the shielding portion 1200 and the core portion 1100. The rib 1300 may be formed on the outer surface of the dielectric core 1110. For example, the rib 1300 may be formed to extend in the longitudinal direction on the outer surface of the dielectric core 1110. In an embodiment of the present invention, the number of ribs 1300 may be one. Therefore, in the communication line 1000, by minimizing the number of ribs 1300 connected to the dielectric core 1110, the magnetic field emitted to the outside from the dielectric core 1110 may be minimized. Further, in the communication line 1000, the number of ribs 1300 can be minimized, and thus bending freedom degree and easiness can be increased.

Meanwhile, as illustrated in FIGS. 1 and 2, the number of first supporter portions 1120 may be three. The three first supporter portions 1120 and one rib 1300 may be formed at equal intervals along a circumference of the dielectric core 1110.

Meanwhile, the core portion 1100, the shielding portion 1200, and the rib 1300 may be made of a dielectric material and formed integrally. In this case, a manufacturing process of the communication line 1000 may be greatly simplified, thereby reducing the manufacturing cost and time. For example, the communication line 1000 may be manufactured through only one injection molding process using one dielectric material.

Figure 3:
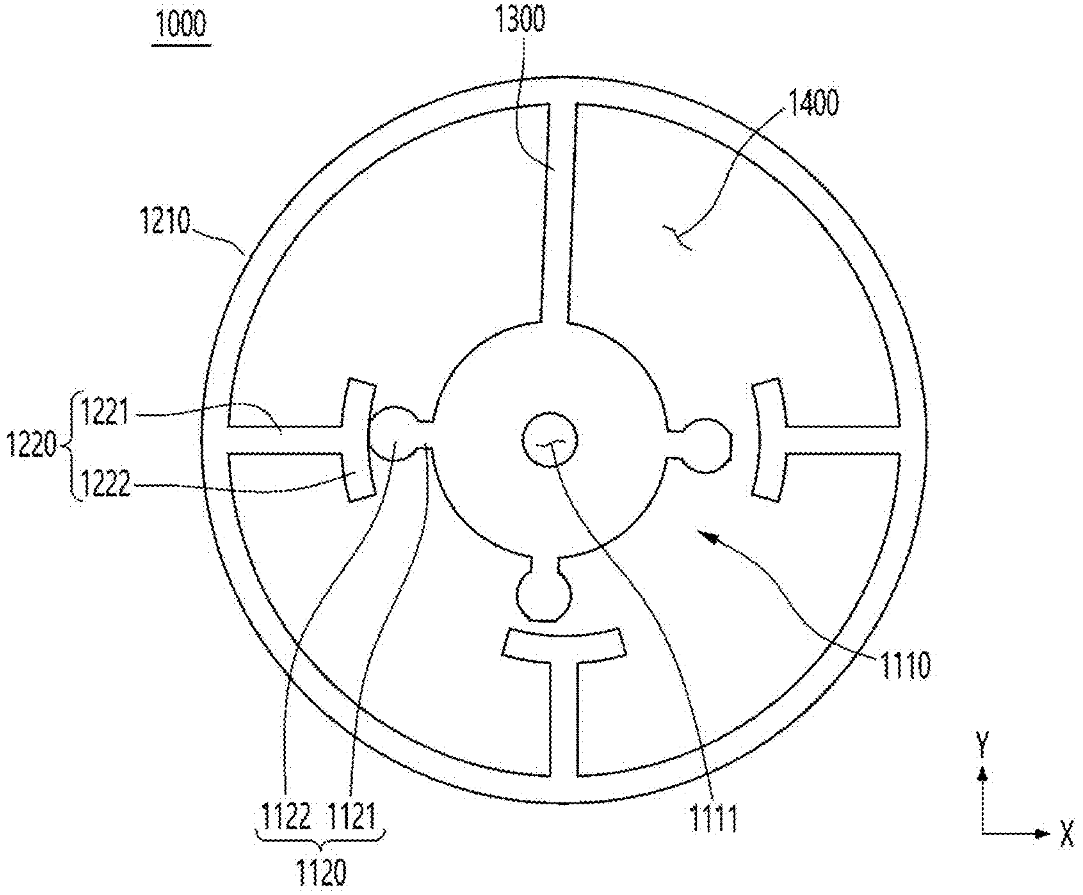
FIG. 3 is a cross-sectional view of the communication line in a direction perpendicular to a longitudinal direction according to an embodiment of the present invention in which physical deformation occurs.

FIG. 3 is a cross-sectional view of the communication line in a direction perpendicular to a longitudinal direction according to an embodiment of the present invention in which physical deformation occurs.

Referring to FIG. 3, when physical deformation occurs in the communication line 1000, locations of the dielectric core 1110 and the first supporter portion 1120 may be changed due to the deformation of the rib 1300. For example, when the rib 1300 is shifted to the left due to the physical deformation, the locations of the dielectric core 1110 and the first supporter portion 1120 may also be shifted to the left. In this case, the protruding member 1122 of the first supporter portion 1120 is shifted to the left and comes into contact with the buffer member 1222 of the second supporter portion 1220, and thus the rib 1300 of the communication line 1000 may not be deformed beyond a certain level. Therefore, when physical deformation, such as an external impact or bending, occurs in the communication line 1000, the communication line 1000 is not deformed beyond a certain level due to the first supporter portion 1120 and the second supporter portion 1220, thereby minimizing transmission loss.

Hereinafter, various embodiments other than the above-described embodiment will be described.

Figure 4:
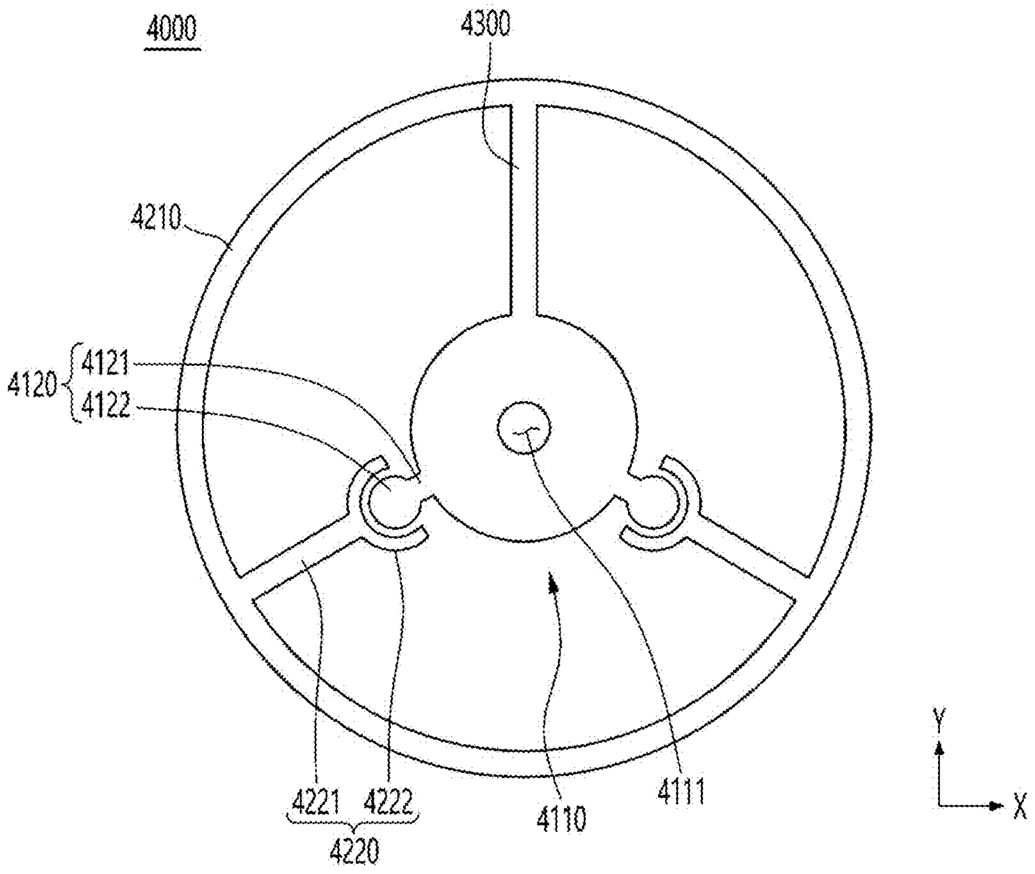
FIG. 4 is a cross-sectional view of a communication line in a direction perpendicular to a longitudinal direction according to another embodiment of the present invention.

FIG. 4 is a cross-sectional view of a communication line in a direction perpendicular to a longitudinal direction according to another embodiment of the present invention.

Referring to FIG. 4, the number of first supporter portions 4120 are two, and the two first supporter portions 4120 and one rib 4300 may be formed at equal intervals along a circumference of the dielectric core 4110. For example, an interval between the two first supporter portions 4120 and intervals between the first supporter portions 4120 and the rib 4300 may be equal.

A communication line 4000 may include a dielectric core 4110, a central hole 4111, a first support member 4121, a protruding member 4122, a shielding 4210, a second support member 4221, a buffer member 4222, etc., and a detailed description of each component illustrated in FIG. 4 may be replaced with the content described above with reference to FIGS. 1 to 3.

FIG. 5 is a cross-sectional view of a communication line in a direction perpendicular to a longitudinal direction according to still another embodiment of the present invention.

Referring to FIG. 5, the number of first supporter portions 5120 is one, and the one first supporter portion 5120 and one rib 5300 may be formed on the same straight line in a radial direction of the dielectric core 5110.

A communication line 5000 may include a dielectric core 5110, a central hole 5111, a first support member 5121, a protruding member 5122, a shielding 5210, a second support member 5221, a buffer member 5222, etc., and a detailed description of each component illustrated in FIG. 5 may be replaced with the content described above with reference to FIGS. 1 to 3.

Meanwhile, a communication system using the communication line 1000 will be described with reference to FIG. 6.

Figure 6:
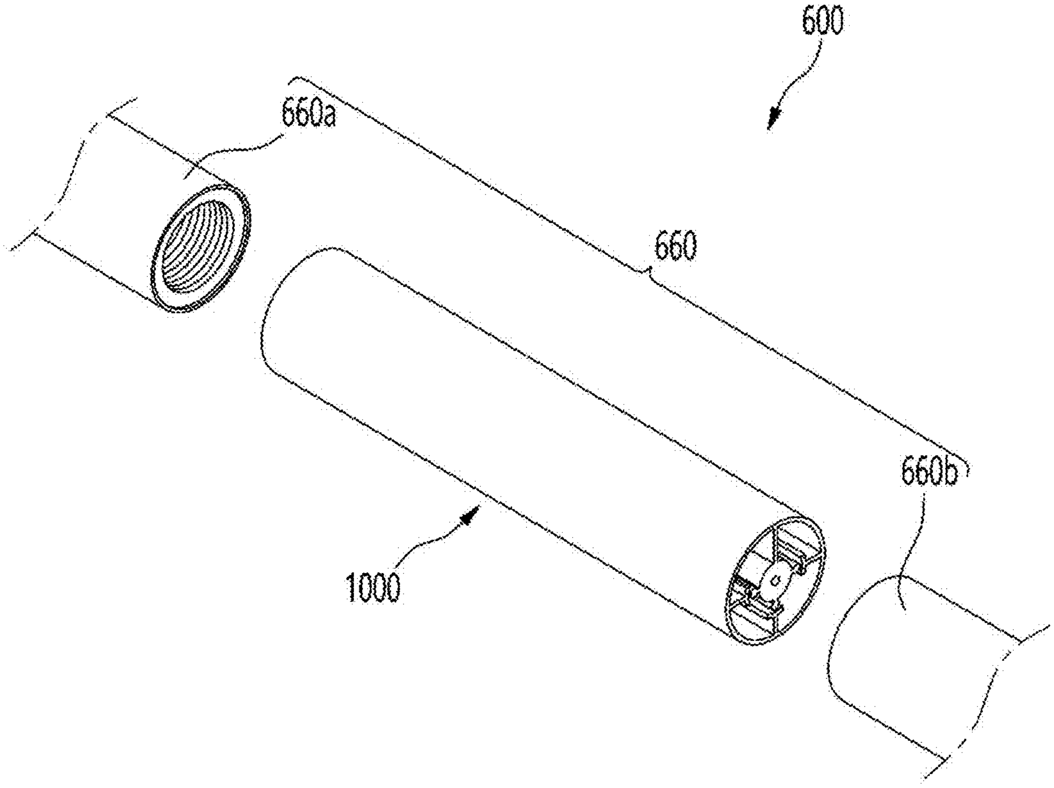
FIG. 6 is a view for describing a communication system according to an embodiment of the present invention.

FIG. 6 is a view for describing a communication system according to an embodiment of the present invention.

In FIG. 6, an antenna 660 and a communication line 1000 are illustrated as being disposed to be spaced apart from each other, but this is for ease of description, and in some cases, the antenna 660 may be in contact with the communication line 1000.

Referring to FIG. 6, a communication system 600 includes the communication line 1000 and the antenna 660 that outputs an electromagnetic wave signal. Here, the antenna 660 may be a transceiver that can not only output an electromagnetic wave signal but also receive an electromagnetic wave signal. In this case, one end of the communication line 1000 may face an antenna **660*a* that transmits a signal, and the other end of the communication line 1000 may face an antenna 660***b* that receives a signal. In this case, the communication line 1000 may transmit electromagnetic wave signals in both directions between the antennas 660*a* and 660*b*.

The antenna 660 may be a component that radiates and guides a communication signal. For example, a signal radiator that radiates a wireless signal may be disposed inside the antenna 660. Here, the signal radiator may have a patch shape or a horn shape. Alternatively, the antenna 660 may only guide a communication signal and may not have a signal radiator inside. For example, the antenna 660*a* may be connected to a signal generating portion disposed on a chip and may guide a signal output from the signal generating portion toward one end of the communication line 1000. In this case, the antenna 660*a* may serve as a waveguide that imparts directionality to a wireless signal or adjusts the direction of the signal.

The operations of the method or algorithm described in association with the embodiments disclosed herein may be implemented directly in a hardware module, a software module, or a combination thereof executed by a processor. The software module may reside in a random access memory (RAM), a flash memory, a read-only memory (ROM), an erasable programmable read-only memory (EPROM), an electrically erasable programmable read-only memory (EEPROM), registers, a hard disk, a removable disk, a compact disc read-only memory (CD-ROM), or any other form of recording medium or storage medium known in the art. An exemplary recording medium or storage medium is coupled to a processor, such that the processor may read information from, and write information to, the recording medium or storage medium. Alternatively, the recording medium or storage medium may be integrated with the processor. The processor and the recording medium or storage medium may reside within an application-specific integrated circuit (ASIC). The ASIC may reside within a user terminal. Alternatively, the processor and the storage medium may reside as separate components within the user terminal.

According to one of the solutions of the present invention, a communication line can include one rib so that a magnetic field emitted to the outside can be reduced.

According to one of the solutions of the present invention, a communication line can include one rib so that bending freedom degree and easiness can be increased.

According to one of the solutions of the present invention, the communication line includes a supporter portion so that a shape of a shielding is not deformed within a certain level when the communication line receives external impact or is bent, and thus transmission loss can be minimized.

The effects obtainable in the present invention are not limited to the above-described effects and other effects that are not described may be clearly understood by those skilled in the art from the above detailed descriptions.

What is claimed is:

1. A communication line comprising:

a shielding portion including a shielding having a hollow tubular shape;

a core portion including a dielectric core that is located inside the shielding portion and extends in a longitudinal direction; and a rib that is located between the shielding portion and the core portion and connects the shielding portion and the core portion, wherein:

the core portion further includes a first supporter portion formed to extend on an outer surface of the dielectric core; and the shielding portion further includes a second supporter portion formed to extend on an inner circumferential surface of the shielding to correspond to the first supporter portion.

2. The communication line of claim 1, wherein the first supporter portion and the second supporter portion are formed to be spaced apart from each other.

3. The communication line of claim 1, wherein the second supporter portion is formed at a location where the second supporter portion comes into contact with the first supporter portion when physically deformed.

4. The communication line of claim 1, wherein a direction in which the first supporter portion is formed on the dielectric core is opposite to a direction in which the second supporter portion is formed on the inner circumferential surface of the shielding.

5. The communication line of claim 1, wherein the first supporter portion includes:

a first support member formed to extend on the outer surface of the dielectric core; and a protruding member that is formed to extend on an outer surface of the first support member and comes into contact with the second supporter portion when physically deformed.

6. The communication line of claim 1, wherein the second supporter portion includes:

a second support member formed to extend on an inner surface of the shielding; and a buffer member that is formed to extend on an outer surface of the second support member and comes into contact with the first supporter portion when physically deformed.

7. The communication line of claim 6, wherein a shape and an area of the buffer member are determined based on a number of first supporter portions.

8. The communication line of claim 1, wherein the first supporter portion is provided as three first supporter portions, and the three first supporter portions and the rib are formed at equal intervals along a circumference of the dielectric core.

9. The communication line of claim 1, wherein the first supporter portion is provided as two first supporter portions, and the two first supporter portions and the rib are formed at equal intervals along a circumference of the dielectric core.

10. The communication line of claim 1, wherein the first supporter portion is provided as one first supporter portion, and the one first supporter portion and the rib are formed on the same straight line in a radial direction of the dielectric core.

11. The communication line of claim 1, wherein the shielding portion, the core portion, and the rib are made of a dielectric material and formed integrally.

12. The communication line of claim 1, wherein the dielectric core has a hollow tubular shape, and an electromagnetic wave signal received at one end of the dielectric core is transmitted to the other end of the dielectric core in the longitudinal direction.

* * * * *